May 7, 1963 R. F. RUTZ 3,089,038

IMPEDANCE MEANS INCLUDING TUNNELING DEVICE FOR PERFORMING LOGIC OPERATIONS

Filed Oct. 14, 1959 4 Sheets-Sheet 1

INVENTOR
RICHARD F. RUTZ
BY Lester H. Clark
ATTORNEY

May 7, 1963 R. F. RUTZ 3,089,038

IMPEDANCE MEANS INCLUDING TUNNELING DEVICE FOR PERFORMING LOGIC OPERATIONS

Filed Oct. 14, 1959 4 Sheets-Sheet 2

United States Patent Office 3,089,038

Patented May 7, 1963

3,089,038
IMPEDANCE MEANS INCLUDING TUNNELING DEVICE FOR PERFORMING LOGIC OPERATIONS

Richard F. Rutz, Fishkill, N.Y., assignor to International Business Machines Corporation, New York, N.Y., a corporation of New York Filed Oct. 14, 1959, Ser. No. 846,421
8 Claims. (Cl. 307—88.5)

This invention relates to methods and apparatus for performing logic operations, and more particularly to electrical logic circuits utilizing quantum mechanical tunneling devices, such as Esaki diodes.

The Esaki diode or tunnel diode was first described in an article in the Physical Review in January 1957, on pages 603–604, entitled "New Phenomenon in Narrow Germanium PN Junctions" by Leo Esaki. As described by Esaki, this diode is a PN junction device in which the junction is very thin, i.e., narrow, in the currently accepted conventional terminology (on the order of 150 Angstrom units or less), and in which the semiconductor materials on both sides of the junction have high impurity concentrations (of the order of $10^{19}$ net donor or acceptor atoms per cubic centimeter for germanium).

The Esaki diode has several unusual characteristics. One is that the reverse impedance is very low, approaching a short circuit. Another is that the forward potential-current characteristic has a negative resistance region beginning at a small value of forward potential (on the order of .05 volt) and ending at a larger forward potential (of the order of 0.2 volt). The potential value at the low potential and of this negative resistance region is very stable with respect to temperature. It does not vary appreciably over a range of temperatures varying from a value near zero degrees K. to several hundred degrees K. At potential values outside the limited potential range described above, the forward resistance of the Esaki diode is positive.

The Esaki article identified germanium as a semiconductor material having this property, and did not identify the impurity materials with which the phenomenon was observed. The phenomenon has since been reported in silicon, gallium arsenide and indium antimonide. Further research has led to the belief that this phenomenon can be observed with any semiconductor material at some temperature level, providing suitable donor and acceptor materials are available. The donor and acceptor materials must be capable of alloying into the matrix material with sufficient concentration to make the extrinsic material degenerate.

In this specification, a P type semiconductor is said to be degenerate if the Fermi level is either within the valence band or, if outside the valence band, it differs from the valence band edge of the energy gap by an energy not substantially greater than $kT$, where $k$ is Boltzmann's constant and T is the temperature in degrees K. Similarly, an N type semiconductor is said to be degenerate if the Fermi level is either within the conduction band or, if outside the conduction band, it differs from the conduction band edge of the energy gap by an energy not substantially greater than $kT$.

In order that a semiconductor junction may have Esaki diode characteristics, the P and N type materials must be such that the valence band of the P type material overlaps the conduction band of the N type material. It is also necessary that the junction between the P and N type materials be very thin, i.e., on the order of 150 Angstrom units or less. Furthermore, it is preferable that the top of the valence band be above the Fermi level on the P side, and that the bottom of the conduction band be below the Fermi level on the N side. It has now been found that acceptor materials which may be introduced into germanium with sufficient concentrations to produce the Esaki effect include gallium, aluminum, boron and indium. Suitable donor materials for germanium include arsenic and phosphorus.

There is shown and described in my copending application Serial No. 831,751, filed August 5, 1959, an oscillator including an Esaki diode and capable of operation at very high frequencies, e.g., in the range from a few megacycles to thousands of megacycles.

It is an object of the present invention to provide a method and apparatus for performing logic operations electrically, utilizing Esaki diode oscillators.

Another object of the present invention is to provide a method and apparatus for performing logic operations at frequencies much higher than has previously been possible with logic circuits of the prior art.

Another object is to provide logic apparatus improved with respect to its insensitivity to temperature variations and to bombardment with nuclear particles.

The foregoing and other objects of the invention are attained in the methods and apparatus described herein. The apparatus preferably employs an Esaki diode oscillator of the type described in my copending application Serial No. 831,751. In accordance with the present invention, such an oscillator is provided with a plurality of input potential sources which are so proportioned that simultaneous inputs from certain combinations of the sources will cause operation of the oscillator in its negative resistance range of the Esaki diode, thereby causing it to oscillate. On the other hand, certain other combinations of input signal potentials cause the diode to be operated in the positive resistance portions of its potential-current characteristic, so that the circuit does not oscillate. Output signal means is coupled to the circuit, and the signal received thereby is utilized to distinguish logically between the oscillating and non-oscillating conditions of the circuit and thereby between the various combinations of input signal sources.

Apparatus constructed in accordance with the present invention may be arranged to perform the conventional commutative and non-commutative logic operations of binary variables including the "AND" operation, the "OR" operation, and the inhibit or "NOT" operation. These three fundamental operations may be combined to produce all of the more complex logical functions of binary variables.

Other objects and advantages of the invention will become apparent from a consideration of the following specification and claims, taken together with the accompanying drawings.

*FIG. 1*

Figure 1:
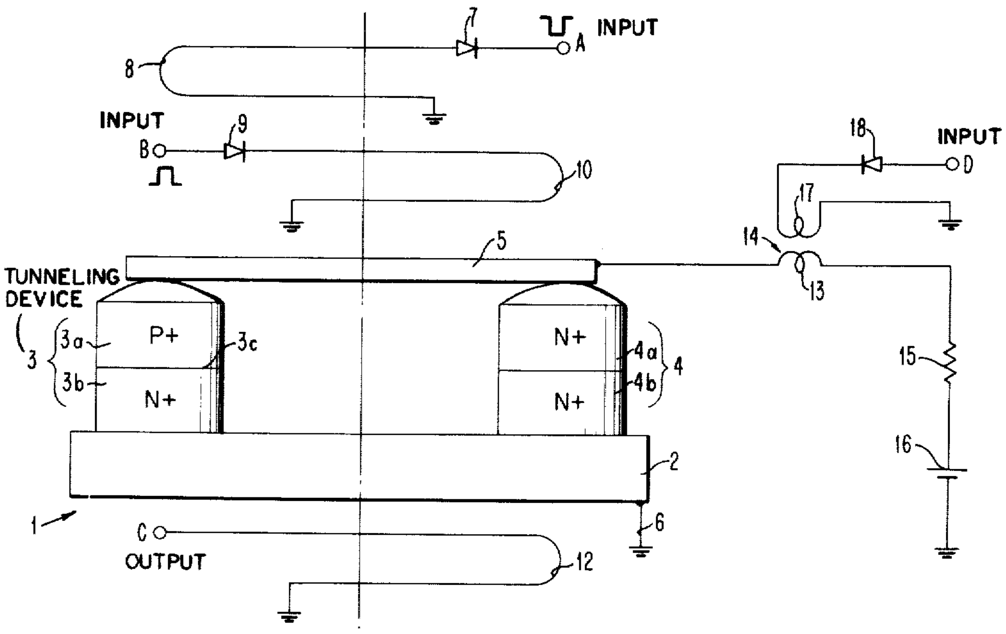
FIG. 1 is a wiring diagram of one form of logic circuit embodying the invention.

This figure illustrates a logic circuit employing an impedance unit 1 having a high natural frequency of oscillation. The impedance unit 1 and methods for constructing it are described more completely and claimed in my copending application Serial No. 831,751, filed August 5, 1959, entitled "Oscillator Apparatus and Methods of Making Same."

The impedance unit 1 comprises a conductive base element 2 on which are mounted an Esaki diode 3 and an impedance element 4. The Esaki diode 3 includes a P+ region *3a* and an N+ region *3b* separated by a boundary junction *3c*. Impedance element 4 is illustrated as comprising a first N+ region *4a* and a second N+ region *4b* which may be of the same or different resistivity. The bottoms of the diode 3 and impedance element 4 are soldered to the base 2 so as to provide an ohmic connection, preferably by the use of N type solder. The tops of the diode 3 and impedanc element 4 are soldered to a conductive bar 5.

The base 2, diode 3, bar 5 and impedance element 4 form a loop circuit having a high natural frequency of oscillation, which frequency is determined primarily by the inductance of the loop and the capacitance of the diode, and hence by the dimensions of the loop and the diode and the resistivities of the diode materials. It is also known that the frequency is affected by the relative values of the total positive resistance in the loop and the negative resistance of the diode (which varies with bias). Hence the resistance of the impedance element 4 is important in determining frequency. The frequency has a narrow band width, but is of course not infinitely sharp. The sharpness is affected by the dimensions and resistivities of the diode.

The dimensions of the diode junction may be controlled by etching. By removing material from the vicinity of the junction, the capacitance of the junction may be reduced while the loop inductance is substantially unaffected. If the etching is continued to the point where the semiconductive material of the diode becomes very thin, then the diode may contribute appreciably to the loop inductance. After that point is reached, the junction capacitance and hence the frequency cannot be practically controlled by etching.

The base 2 is grounded at 6. An input terminal A is connected through an isolating diode 7 to a single turn inductive element 8 which is inductively coupled with the loop circuit 3, 4, 5, 6. The other end of the loop 8 is grounded. Another input terminal B is connected through a blocking diode 9 to a single turn inductive element 10, which is inductively coupled to the loop circuit 3, 4, 5, 6. The opposite end of inductive element 10 is grounded. An output terminal C is connected to a single turn inductive element 12, also coupled to the loop 3, 4, 5, 6 inductively and having its opposite terminal grounded. More than one turn may be employed in these inductive elements 8, 10 and 12. At the high frequencies used, however, a single turn is generally sufficient. In some cases, the isolating diode may be unnecessary and so may be omitted.

The bar 5 is connected through a winding 13 of an input transformer 14 and a resistor 15 to a battery 16, which serves as a principal source of power for the loop circuit 3, 4, 5, 6. The opposite terminal of battery 16 is grounded. Transformer 14 has another winding 17, one terminal of which is grounded and the other terminal of which is connected through a blocking diode 18 to an input terminal D.

The coupling between the inductive elements 8, 10 and 12, on the one hand, and the oscillator loop 3, 4, 5, 6, on the other hand, should be close. The power supply circuit 13, 15, 16 has an impedance relatively high as compared to the impedance of loop 3, 4, 5, 6, so that oscillations in the loop at the natural frequency thereof are substantially blocked from the power supply circuit. The resistor 15 should have a high resistance (e.g., 1 ohm), as compared to that of the loop 3, 4, 5, 6 (e.g., 50 milliohms) as mentioned in my copending application Serial No. 831,751, mentioned above, to inhibit natural oscillations of any frequency in the power supply circuit.

The terminal D may be used as an input of a clock pulse, or the like having a frequency low as compared to the natural frequency of oscillation of the loop. In general, it is not suitable as a terminal for an output.

As shown, the loop 8 is opposite in sense to the loop 10. A negative-going signal at terminal A would start oscillation of the loop, while a positive-going signal at B would also start oscillation. The diodes 7 and 9 are poled to block feedbacks from one input to the other. It is assumed that output terminal C is connected to another logic stage input terminal provided, if desired, with a blocking diode of the proper polarity.

Any one of the three terminals A, B or C may serve either as an output terminal, or as an input terminal. The battery 16 may be regarded as a source of a steady input signal. It may be replaced by a direct-coupled source of square wave or pulse signals. Other conductively coupled sources of potential may be added.

*FIG. 2*

This figure illustrates a logic circuit apparatus embodying the present invention but different from that shown in FIG. 1 in that the several signal input sources are capacitively coupled to the oscillator rather than being inductively coupled. These elements which correspond in structure and function to their counterparts in FIG. 1 have been given the same reference numerals and will not be further described.

Two signal input terminals E and F are provided, each coupled through an isolating diode 19 and a capacitor 20 to a wire 21 connecting resistor 15 with the bar 5 of the impedance unit 1. Either of the terminals E and F may be used as an output terminal, providing the blocking diode is omitted or properly poled and biased.

*FIG. 3*

While the following description of the operation of the circuits of this invention is based on certain theories, it should be understood that the invention is not limited to any particular theory of operation.

Figure 2:
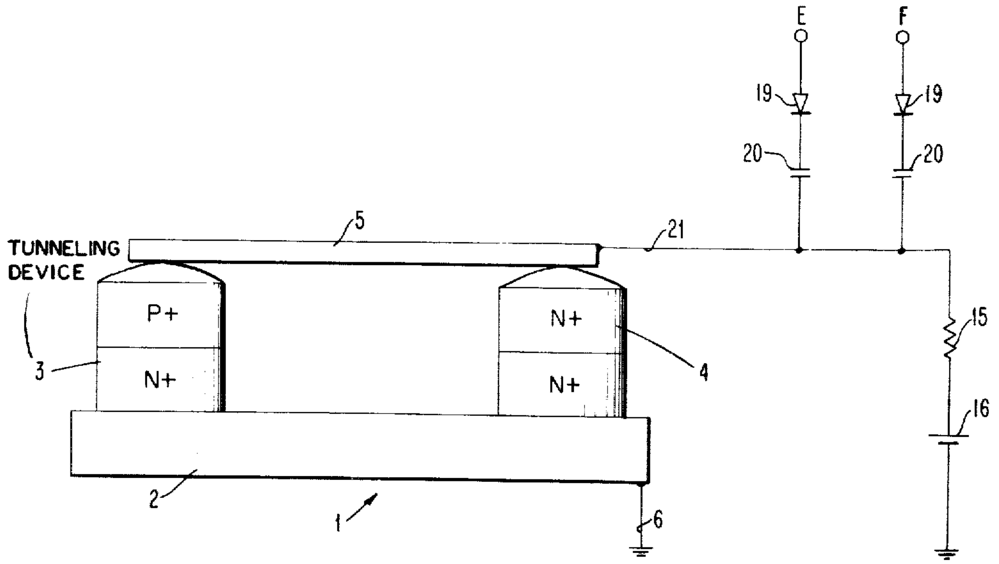
FIG. 2 is a wiring diagram of a modified form of logic circuit embodying the invention.
Figures 3, 3A, 3B, 3C, 3D:
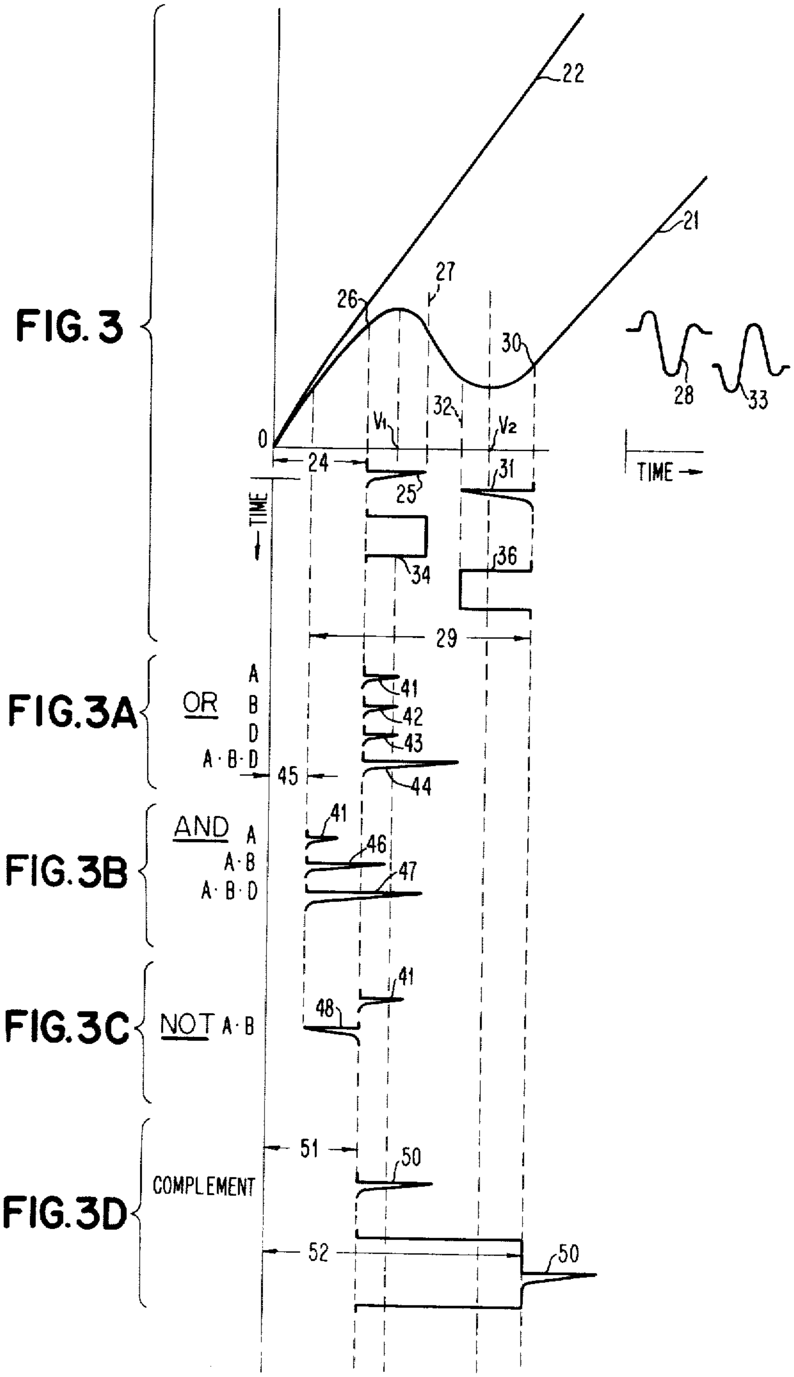
FIG. 3 is a graphical illustration of the current-potential characteristics of the principal elements of the logic circuit as shown in FIGS. 1 and 2, together with a graphical illustration of the operation of the circuit.
FIG. 3A is a graphical illustration of an "OR" operation of the circuits of FIGS. 1 and 2.
FIG. 3B is a graphical illustration of an "AND" operation of the circuits of FIGS. 1 and 2.
FIG. 3C is a graphical illustration of an inhibit operation of the circuit of FIGS. 1 and 2.
FIG. 3D is a graphical illustration of a complementary operation of the circuits of FIGS. 1 and 2.

The curve 21 of FIG. 3 illustrates a typical potential-current static characteristic of an Esaki diode such as the diode 3 of FIGS. 1 and 2. Note that it includes a positive resistance region in a potential range between zero and $V_1$, a negative resistance region in a range between $V_1$ and $V_2$, and another positive resistance region in a range covering potentials greater than $V_2$. The curve 22 of FIG. 3 represents the static potential-current characteristic of the impedance element 4. The curve 22 is drawn as an impedance parallel to the Esaki diode rather than as a series load on the diode. The slope of curve 22 must be less than the slope of the negative resistance portion of curve 21.

For purposes of illustration, consider that, in the circuit of FIG. 1, the battery 16 has a potential value indicated at 24 in FIG. 3, so that the diode 3 is operating at a point 26 in the positive resistance region to the left of the peak at $V_1$. The circuit is then not oscillating. Now assume that an input pulse is supplied through one of the terminals A, B or D having a polarity effective to induce a potential pulse 25 in the loop 3, 4, 5, 6. The pulse 25 adds its potential to that of the biasing battery and thereby shifts the operating point of the Esaki diode from the point 26 in FIG. 3 past the potential $V_1$ to a point on the vertical line 27, located within the negative resistance region. The circuit then passes through a single cycle of oscillation, the variation in current flow in the loop circuit 3, 4, 5, 6 being illustrated in an approximate form at 28 in FIG. 3.

In a somewhat similar fashion, the battery 16 may be selected to have the potential value indicated at 29 in FIG. 3, so that the circuit normally operates at the point 30. If an input pulse such as that shown at 31 is then induced in the loop, the operating point shifts to a point on the vertical line 32 in the negative resistance region, with a resulting output signal as indicated at 33.

If the induced input signal is less sharply peaked, as indicated at 34 in FIG. 3, so that it extends over several periods of the natural frequency of the impedance unit 1, then the circuit will oscillate over several cycles, producing a burst of output signal frequency. A similar long duration induced input pulse 36 applied when operating at the point 30, would produce a similar burst of output signals. It is easy to maintain the induced input signal over several cycles, as illustrated at 34 and 36, even with inductive type signal input coupling, as illustrated for the terminals A, B and C in FIG. 1.

*FIGS. 3A to 3D*

These figures illustrate graphically the operation of the circuit of FIGS. 1 and 2 as logic circuits. In these figures, it is assumed that the terminal C is used as an output terminal, whereas the terminals A, B and D are used as signal input terminals.

In FIG. 3A, the battery 16 is selected to have a bias potential value as shown at 24, and the signal inputs A, B and D are selected to induce equal potentials in the loop as shown at 41, 42 and 43. It may be seen that the presence of any one of the three signal inputs A, B, D will shift the circuit from its positive resistance region to its negative resistance region, thereby producing an oscillation and an output signal. Similarly, if two of the signal inputs or if all three occur simultaneously, they will still produce substantially the same output signal even though the sum of the input signals is greater, as shown at 44. This is typical OR circuit operation.

FIG. 3B illustrates the potential conditions in AND circuit operation. The battery 17 is here selected to have a substantially lower potential, as indicated at 45. Each of the three signal inputs has the same individual potential 41, as shown in FIG. 3A. Two of the inputs together produce a total potential indicated at 46, and the three inputs together produce a total input signal 47. It may be seen that only the total input signal 47 added to the bias 45 is effective to shift the oscillator to its negative resistance region and produce an output signal. This is typical AND circuit operation. The circuit distinguishes logically between the input condition when all three signals are received and all other possible combinations of input signals.

FIG. 3C illustrates a not or inhibit operation. The bias potential may have the value indicated at 24, as in FIG. 3A. Signal input B again has the potential value 41. Signal input A now has a potential 48, equal in magnitude to the signal 41, but opposite in polarity. Signal 41 alone, plus the biasing potential 24 is effective to produce an output signal. If signals A and B occur together, the signal 48 counteracts the signal 41 and no output signal is produced. The signal A is then functioning as an inhibit signal.

It should be noted that in all of FIGS. 3A, 3B and 3C, the biasing potential 24 or 45 is necessary to produce an output signal. Where the steady biasing potential is replaced by a clock pulse, then the clock pulse may be made sharper than the input signals and is effective to reshape these signals so as to produce distinct output signals.

FIG. 3D illustrates a type of operation which is especially useful in multistage apparatus, where it is desired to read out, from one or more stages, the complements of the input signals. As there shown, each input signal may have a value indicated by the peaked pulse 50. If a direct reading of the input signals is required, a clock pulse having the value 51 is supplied in which case the circuit produces an output signal when the pulse 50 occurs concurrently with the readout signal 51. If the complement output is desired, a larger readout signal 52 is supplied which is effective to swing the circuit through the negative resistance region to the high potential positive resistance region, so that the input signal 50 is then ineffective to initiate an oscillation. Signal 52 has the effect of inverting all the input signals. For example, referring to FIG. 3C, signal 48 would now produce an oscillation and signal 41 would not.

A switching transient appears at the output when pulse 52 turns on and off. This could be blanked out of later stages or alternatively utilized there, if desired.

*FIG. 4*

This figure illustrates a logic matrix including three parallel (i.e., concurrently operated) stages 53, 54 and 55 driving a series stage 56, which in turn drives another series stage 57. By series stages it is meant that the stages are individually operated rather than concurrently. The bias potential for all five of the stages is supplied by a signal generator 58 having three output phases 59, 60 and 61. The pulses of the three phases are coordinated so that the leading edges of phase 59 overlap trailing edges of phase 61 and their trailing edges of phase 59 overlap the leading edges of phase 60. However, the central portion of each pulse does not overlap the pulses in either of the other two phases. The three phase clock pulses appear respectively at output terminals **59*a*, 60*a* and 61*a* of the pulse generator 58. The three parallel stages 53, 54 and 55 are all supplied by the phase 59, whereas the three series stages 55, 56, 57 are supplied respectively with the consecutive phases 59, 60, 61. The C terminal of each stage is utilized as the output terminal. Note that the output terminals of stages 53, 54 and 55 are connected to the input terminals of stage 56, which thereby combines the logic of the stages 53, 54, 55. The output terminal of stage 56 is connected to one of the input terminals of stage 57** but the other two terminals are utilized for other input connections, not shown.

The overlapping of the phases 59, 60 and 61 is essential in the system just described to keep the signals flowing through a series matrix, since one stage must always be oscillating, and two consecutive stages must oscillate concurrently to transmit a signal from one to another. However, it is necessary that the first stage in a series sequence cut off its oscillation before the second stage cuts off its oscillation, and before the third stage in the series starts oscillating in order to prevent undesirable feedbacks. This is accomplished by the overlapping clock pulses illustrated in FIG. 5.

The clock pulse source must have a potential proportioned with respect to the potentials of the other input sources so that the clock pulse source is essential in each combination of inputs which will cause oscillating operation of any stage.

Delay lines may be inserted between the stages of the matrix, as indicated diagrammatically at 49. If suitable delay lines are provided, the overlap of the clock pulses between successive series stages may not be needed. In other words, the output produced at one stage will not arrive at the succeeding stage until a time sufficiently later so that the first stage clock pulse has turned off. At the high frequencies involved, the delay lines may consist simply of suitable lengths of transmission line between the stages.

Figures 4, 5:
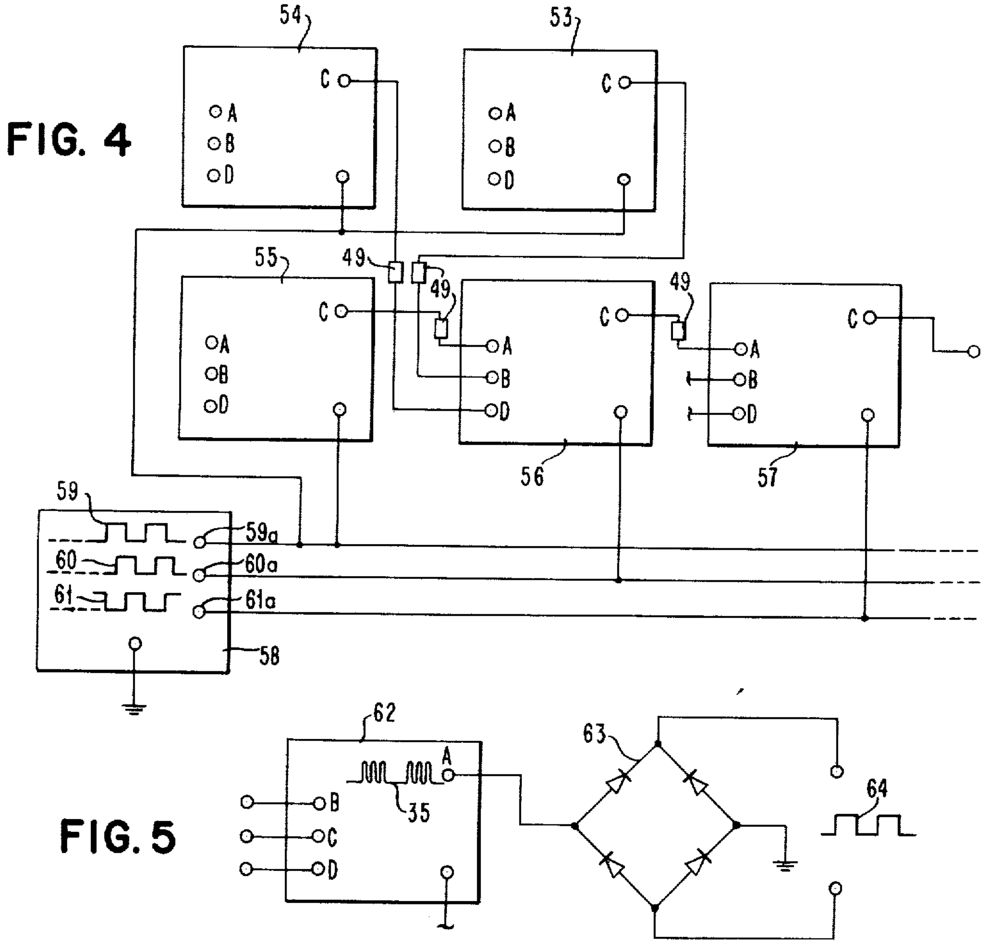
FIG. 4 is a schematic illustration of a logic network including three parallel stages of the type shown in FIG. 1 and three series stages.
FIG. 5 is a schematic illustration of an output arrangement which may be used with the invention.
Figure 6:
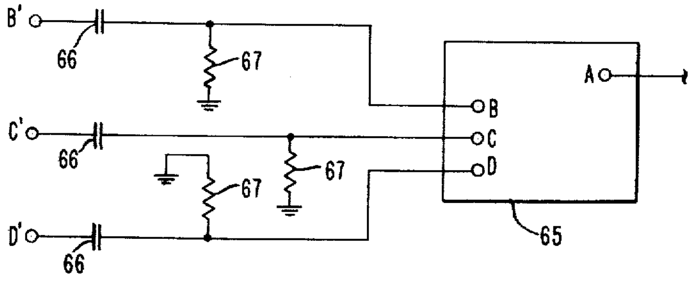
FIG. 6 is a schematic illustration of an input arrangement which may be used with the invention.

*FIG. 5*

Where a logic stage 62 is utilized to produce bursts of oscillations, as illustrated at 35 in FIG. 5, its output may be connected through a conventional rectifier 63 to produce a series of square waves 64, each of which corresponds in duration to one of the bursts of oscillations from the logic stage.

*FIG. 6*

Where it is desired to feed a logic stage 65, from a number of signal input sources B′, C′, D′, of varying wave forms and to have the logic stage produce a single output pulse, then each of the inputs may be provided with a differentiating circuit of conventional form, consisting of a capacitor 66 and a resistor 67 connected in series between the input terminal and ground, the corresponding input terminal of the logic stage being connected to the common junction between the capacitor and the resistor. In this fashion, sharply peaked input pulses are provided to the stage 65, whatever the shape of the pulses received at input terminals B′, C′ and D′.

*FIG. 7*

Figure 7:
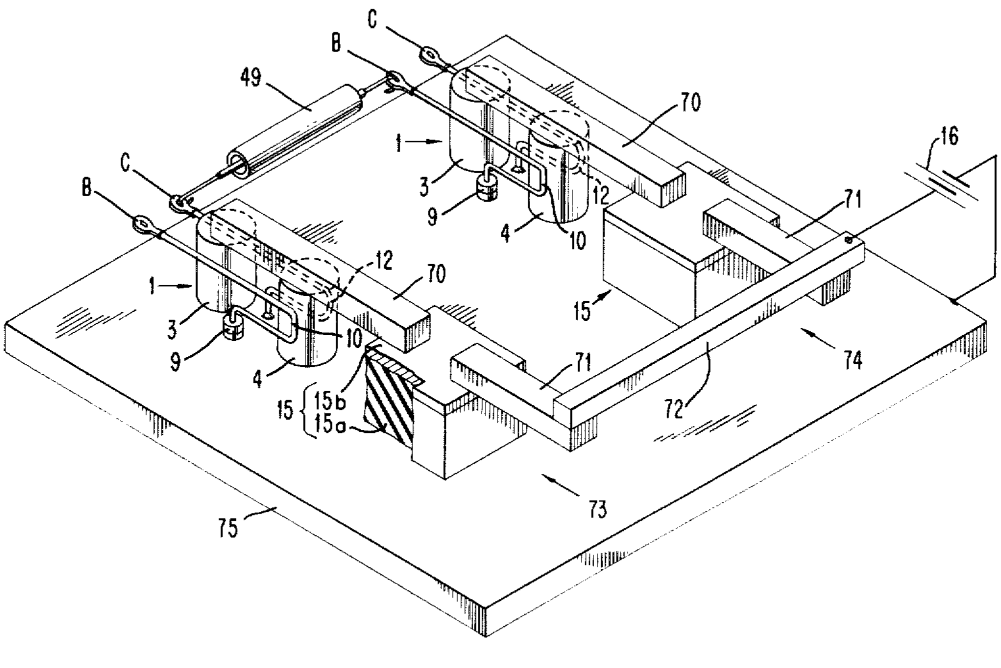
FIG. 7 is a perspective view showing two stages of a multistage apparatus embodying the invention.

The dimensions of the impedance units 1 are small as compared to the wave lengths of the frequencies at which they operate. Because of their small dimensions as compared to the wave lengths, these impedance units are not efficient antennas and do not radiate strongly. It is therefore possible to construct a multiple stage unit using these circuits with a minimum of shielding between the stages. Such a multiple stage unit is illustrated in FIG. 7. Those elements in FIG. 7 which correspond to their counterparts in FIG. 1 have been given the same reference numerals or primed reference numerals and will not be described in detail.

Two logic stages are shown at 73 and 74. Each of the two stages has a single signal input terminal B and an output terminal C. In each of the stages, the bar 5 of FIG. 1 is replaced by an elongated bar 70 projecting to the right beyond the impedance element 4. The right-hand end of the bar 70 is supported on a resistor 15, which comprises a base 15*a*, of insulating material and a top plate 15*b* bonded to the base, and made of electrically conductive material having the desired resistivity. Another bar 71 is soldered to the other end of the resistor plate 15*b* and projects to the right from that plate. The opposite ends of the bars 71 in the two stages 73 and 74 are connected by a bar 72, which is in turn connected through a suitable wire to the positive terminal of battery 16. The negative terminal of battery 16 is connected to an underlying base 75, which supports both the stages 73 and 74.

The input loop 10 (shown with square corners) connected to the terminal B of each stage is shown on one side of its associated impedance unit 1, and the output loop 12 (shown with rounded corners to clarify the drawing) connected to the output terminal C of each stage is located in back of the impedance unit 1. These relative locations are selected to minimize the coupling between the loops 10 and 12, while providing reasonably close coupling between each of the loops and the associated oscillator loop 3, 4, 70, 75. The loops 10 and 12 may be formed of any wire which is stiff enough to support itself. Alternatively, an insulating support structure may be provided.

The output terminal C of stage 73 is connected to input terminal B of stage 74 through a transmission line 49, which serves as a delay line, as described in connection with FIG. 4. The line 49 may be a coaxial cable, and may be supported on the base 75 by a suitable insulator (not shown).

Additional input terminals and input coupling loops may be provided for each stage as required by the particular logic operation to be carried out. Only one input terminal is shown for each stage, in order to simplify the drawing.

While I have shown and described a preferred embodiment of my invention, other modifications thereof will readily occur to those skilled in the art, and I therefore intend my invention to be limited only by the appended claims.

I claim:

1. Logic circuit means comprising an impedance unit having a natural frequency of oscillation, said unit including a quantum mechanical tunneling device, and means connecting the tunneling device in a circuit, said tunneling device having a potential-current characteristic including an intermediate potential negative resistance region between lower and higher potential positive resistance regions; a plurality of input sources of electrical energy coupled to the circuit, at least some of the sources being shiftable in potential, said sources cooperating in at least one predetermined combination of the potentials thereof to operate the tunneling device in the intermediate potential negative resistance region of its characteristic and thereby to initiate oscillation of said circuit, in at least a second predetermined potential combination to operate the tunneling device in the lower potential positive resistance region and thereby to inhibit oscillation of said circuit, and in at least a third predetermined potential combination to operate the tunneling device in the higher potential positive resistance region of its characteristic and thereby to inhibit oscillation of said circuit; and signal output means coupled to the circuit and responsive to oscillation and non-oscillation thereof, whereby said one predetermined combination may be logically distinguished from said other second and third predetermined combinations.

2. Logic circuit means as defined in claim 1, in which said third predetermined combination of input sources comprises a complementing input source having a potential effective to shift the operating point of the tunneling device to the negative resistance region if the other input sources combined would cause operation in one of the positive resistance regions and to shift the operating point to one of the positive resistance regions if the other input sources combined would cause operation in the negative resistance region.

3. Logic circuit apparatus, comprising at least three stages, each stage including an impedance unit having a natural frequency of oscillation, said unit including a quantum mechanical tunneling device, and means connecting the tunneling device in a circuit, said tunneling device having a potential-current characteristic including a negative resistance region between two positive resistance regions; a plurality of input sources of electrical energy coupled to the circuit, at least some of the sources being shiftable in potential, said sources cooperating in at least one predetermined combination of the potentials thereof to operate the tunneling device in the negative resistance region of its characteristic and in at least one other predetermined potential combination to operate the tunneling device in a positive resistance region of its characteristic, and signal output means coupled to the circuit, whereby said one predetermined combination may be logically distinguished from said other predetermined combination; a source of clock pulses having at least three time phases, the pulses of each phase having leading edges which overlap the trailing edges of the preceding phase and also having trailing edges which overlap the leading edges of the following phase pulses, means connecting the output means of all but the last stage to constitute one of the input sources of a following stage, and means connecting the consecutive phases of the clock pulse source to the consecutively connected stages, so that each stage has one of its input sources constituted by one of the clock pulse phases, each phase of the clock pulse source having a pulse potential proportioned with respect to the other input sources of each stage so that a clock pulse source is essential in each of the predetermined combinations which cause operation of a tunneling device in its negative resistance regions.

4. Electric circuit apparatus, comprising a flat conductive plate, a plurality of stages mounted on said plate, each stage comprising a quantum mechanical tunneling device and a resistive impedance, said tunneling device and said impedance each having one end soldered to said plate, a conductor connected to the other ends of said tunneling device and said impedance and supported thereby and extending parallel to said plate, said plate, conductor, tunneling device and impedance constituting a loop having a natural frequency of oscillation, said tunneling device and said impedance having dimensions small as compared to the wave length of said natural frequency, and being separated from one another by a distance short as compared to said wave length, at least one input source of electrical energy for all the stages, and means coupling the source to all the stages including conductor means extending parallel to the plate.

5. Electric circuit apparatus, comprising a flat conductive plate, a plurality of stages mounted on said plate, each said stage comprising a quantum mechanical tunneling device and a resistive impedance, said tunneling device and said impedance being soldered at one end to said plate, a conductor connected to the other ends of said tunneling device and said impedance and supported thereby and extending parallel to said plate, said plate, conductor, tunneling device and impedance constituting a loop having a natural frequency of oscillation, said tunneling device and said impedance having dimensions small as compared to the wave length of said natural frequency, and being separated from one another by a distance short as compared to said wave length, an input coupling coil magnetically linked to said loop, and an output coupling coil magnetically linked to said loop; and transmission line means connecting the output of one stage to the input of another.

6. Electric circuit apparatus, comprising a flat conductive plate, a plurality of stages mounted on said plate, each said stage comprising a quantum mechanical tunneling device and a resistive impedance, said tunneling device and said impedance being soldered at one end to said plate, a conductor connected to the other ends of said tunneling device and said impedance and supported thereby and extending parallel to said plate, said plate, condutor, tunneling device and impedance constituting a loop having a natural frequency of oscillation, said tunneling device and said impedance having dimensions small as compared to the wave length of said natural frequency, and being separated from one another by a distance short as compared to said wave length, power supply means for each stage including a bus bar connected to a source of electrical energy, a resistor for each stage comprising a resistance element and a block supporting said element with a surface parallel to the plate, said conductor comprising a first bar soldered to the tunneling device, the impedance and one end of the resistor, and a second bar soldered to the other end of the resistor and the bus bar.

7. Logic circuit apparatus, comprising at least three stages, each stage including an impedance unit having a natural frequency of oscillation, said unit including an element having a potential-current characteristic including a negative resistance region between two positive resistance regions, and means connecting the element in a circuit; a plurality of input sources of electrical energy coupled to the circuit, at least some of the sources being shiftable in potential, said sources cooperating in at least one predetermined combination of the potentials thereof to operate the element in the negative resistance region of its characteristic and thereby to initiate oscillation of the circuit, and in at least one other predetermined potential combination to operate the element in a positive resistance region of its characteristic and thereby to inhibit oscillation of the circuit, and signal output means coupled to the circuit and distinctively responsive to the oscillation and non-oscillation thereof, whereby said one predetermined combination may be logically distinguished from said other predetermined combination; a source of clock pulses having at least three time phases, the pulses of each phases having leading edges which overlap the trailing edges of the preceding phase pulses and also having trailing edges which overlap the leading edges of the following phase pulses, means connecting the output means of all but the last stage to constitute one of the input sources of a following stage, and means connecting the consecutive phases of the clock pulse source to the consecutively connected stages, so that each stage has one of its input sources constituted by one of the clock pulse phases, each phase of the clock pulse source having a pulse potential proportioned with respect to the other input sources of each stage so that a clock pulse source is essential in each of the predetermined combinations which cause operation of an element in its negative resistance region.

8. Logic circuit means comprising an impedance unit having a natural frequency of oscillation, said unit including a quantum mechanical tunneling device, and means connecting the tunneling device in a circuit, said tunneling device having a potential-current characteristic inluding a negative resistance region between two positive resistance regions; a plurality of input sources of electrical energy coupled to the circuit, at least some of the sources being shiftable in potential, said sources cooperating in at least one predetermined combination of the potentials thereof to operate the tunneling device in the negative resistance region of its characteristic and thereby to initiate oscillation of said circuit and in at least one other predetermined potential combination to operate the tunneling device in the lower potential region of said two positive resistance regions of its characteristic and thereby to inhibit oscillation of said circuit; and signal output means coupled to the circuit and responsive to oscillation and non-oscillation thereof, whereby said one predetermined combination may be logically distinguished from said other predetermined combination.

References Cited in the file of this patent

UNITED STATES PATENTS

| | | |
|---|---|---|
| 2,629,834 | Trent | Feb. 24, 1953 |
| 2,901,638 | Huang | Aug. 25, 1959 |
| 2,903,603 | Glenn | Sept. 8, 1959 |
| 2,906,870 | Huntley | Sept. 29, 1959 |
| 2,986,724 | Jaeger | May 30, 1961 |

OTHER REFERENCES

Gottlieb: Using the Tunnel Diode, Electronics Industries, March 1960, page 110.

Notice of Adverse Decision in Interference

In Interference No. 94,367 involving Patent No. 3,089,038, R. F. Rutz, IMPEDANCE MEANS INCLUDING TUNNELING DEVICE FOR PERFORMING LOGIC OPERATIONS, final judgment adverse to the patentee was rendered Oct. 6, 1965, as to claims 1 and 8.

[*Official Gazette December 14, 1965.*]